(12) United States Patent
Verma et al.

(10) Patent No.: US 11,101,165 B2
(45) Date of Patent: Aug. 24, 2021

(54) METHOD FOR FABRICATING SEMICONDUCTOR DEVICE COMPRISING A DEEP TRENCH ISOLATION STRUCTURE AND A TRAP RICH ISOLATION STRUCTURE IN A SUBSTRATE

(71) Applicant: UNITED MICROELECTRONICS CORP., Hsin-Chu (TW)

(72) Inventors: Purakh Raj Verma, Singapore (SG); Chia-Huei Lin, New Taipei (TW); Kuo-Yuh Yang, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/561,026

(22) Filed: Sep. 5, 2019

(65) Prior Publication Data
US 2020/0006117 A1    Jan. 2, 2020

Related U.S. Application Data

(62) Division of application No. 15/888,072, filed on Feb. 4, 2018, now Pat. No. 10,460,980.

(30) Foreign Application Priority Data

Dec. 29, 2017    (CN) .......................... 201711474311.1

(51) Int. Cl.
*H01L 21/762* (2006.01)
*H01L 21/761* (2006.01)
*H01L 21/311* (2006.01)
*H01L 21/763* (2006.01)
*H01L 21/764* (2006.01)
*H01L 29/06* (2006.01)
*H01L 21/8234* (2006.01)
(Continued)

(52) U.S. Cl.
CPC .. *H01L 21/76205* (2013.01); *H01L 21/31144* (2013.01); *H01L 21/761* (2013.01); *H01L 21/763* (2013.01); *H01L 21/764* (2013.01); *H01L 21/76224* (2013.01); *H01L 21/76229* (2013.01); *H01L 21/823481* (2013.01); *H01L 27/088* (2013.01); *H01L 29/0649* (2013.01); *H01L 29/66575* (2013.01); *H01L 29/1083* (2013.01); *H01L 29/66545* (2013.01)

(58) Field of Classification Search
None
See application file for complete search history.

(56) References Cited

U.S. PATENT DOCUMENTS 4,462,040 A * 7/1984 Ho .......................... G11C 11/35
257/302
4,745,081 A * 5/1988 Beyer ................. H01L 21/2255
257/E21.149

(Continued)

*Primary Examiner* — Nilufa Rahim
(74) *Attorney, Agent, or Firm* — Winston Hsu

(57) ABSTRACT

A method for fabricating semiconductor device comprising the steps of: forming a first trench and a second trench in a substrate; forming a liner in the first trench and the second trench; forming a first patterned mask on the substrate to cover the second trench; removing the liner in the first trench; removing the first patterned mask; and forming an insulating layer in the first trench and the second trench to form a trap rich isolation structure in the first trench and a deep trench isolation structure in the second trench.

10 Claims, 4 Drawing Sheets

(51) Int. Cl.
*H01L 29/66* (2006.01)
*H01L 27/088* (2006.01)
*H01L 29/10* (2006.01)

(56) References Cited

U.S. PATENT DOCUMENTS

| | | | |
|---|---|---|---|
| 5,851,900 A * | 12/1998 | Chu | H01L 21/76224 |
| | | | 438/434 |
| 6,610,578 B2 * | 8/2003 | Norstrom | H01L 21/02164 |
| | | | 438/369 |
| 8,722,508 B2 | 5/2014 | Botula et al. | |
| 9,012,996 B2 | 4/2015 | Zhong et al. | |
| 9,514,987 B1 | 12/2016 | Gambino et al. | |
| 10,026,728 B1 | 7/2018 | Agam | |
| 10,103,067 B1 * | 10/2018 | Baars | H01L 21/84 |
| 2010/0062579 A1 | 3/2010 | Juengling | |
| 2013/0320459 A1 * | 12/2013 | Shue | H01L 21/76283 |
| | | | 257/392 |
| 2015/0004778 A1 | 1/2015 | Botula | |
| 2015/0279879 A1 * | 10/2015 | Chou | H01L 21/76237 |
| | | | 257/446 |
| 2016/0163583 A1 | 6/2016 | Liu | |
| 2016/0372592 A1 | 12/2016 | Cho | |
| 2018/0096884 A1 | 4/2018 | Shank | |
| 2018/0158912 A1 * | 6/2018 | Han | H01L 21/823892 |

\* cited by examiner

METHOD FOR FABRICATING SEMICONDUCTOR DEVICE COMPRISING A DEEP TRENCH ISOLATION STRUCTURE AND A TRAP RICH ISOLATION STRUCTURE IN A SUBSTRATE

CROSS REFERENCE TO RELATED APPLICATIONS

This application is a division of U.S. application Ser. No. 15/888,072 filed Feb. 4, 2018, and incorporated herein by reference in its entirety.

BACKGROUND OF THE INVENTION

1. Field of the Invention

The invention relates to a method for fabricating semiconductor device, and more particularly to a method for forming a depth trench isolation structure in a substrate and a trap rich isolation structure in the substrate and surrounding the deep trench isolation structure.

2. Description of the Prior Art

In radio frequency (RF) integrated circuit application, such as RF switch device or power amplifier device, performance is suffered from "parasitic surface charge" issue, which in turn generates harmonic effect. There are several wafer process technologies available for solving the issue such as using semiconductor-on-insulator (SOI) wafer to isolate the charges from the high resistivity wafer substrate. However, as the RF switch goes high frequency, it is more sensitive to RF harmonic effect induced by the parasitic surface charges. The problem needs to be solved.

SUMMARY OF THE INVENTION

According to an embodiment of the present invention, a method for fabricating semiconductor device includes the steps of: forming a first trench and a second trench in a substrate; forming a liner in the first trench and the second trench; forming a first patterned mask on the substrate to cover the second trench; removing the liner in the first trench; removing the first patterned mask; and forming an insulating layer in the first trench and the second trench to form a trap rich isolation structure in the first trench and a deep trench isolation structure in the second trench.

According to another aspect of the present invention, a semiconductor device includes: a metal-oxide semiconductor (MOS) transistor on a substrate; a deep trench isolation structure in the substrate and around the MOS transistor; and a trap rich isolation structure in the substrate and surrounding the deep trench isolation structure.

Preferably, the deep trench isolation structure includes a liner in the substrate and an insulating layer on the liner, in which the top surfaces of the liner and the insulating layer are coplanar. The trap rich isolation structure is made of an insulating layer, in which the liner includes silicon oxide and the insulating layer includes undoped polysilicon or silicon nitride. According to yet another embodiment of the present invention, the trap rich isolation structure and the deep trench isolation structure could include same depth or different depths depending on the demand of the product.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
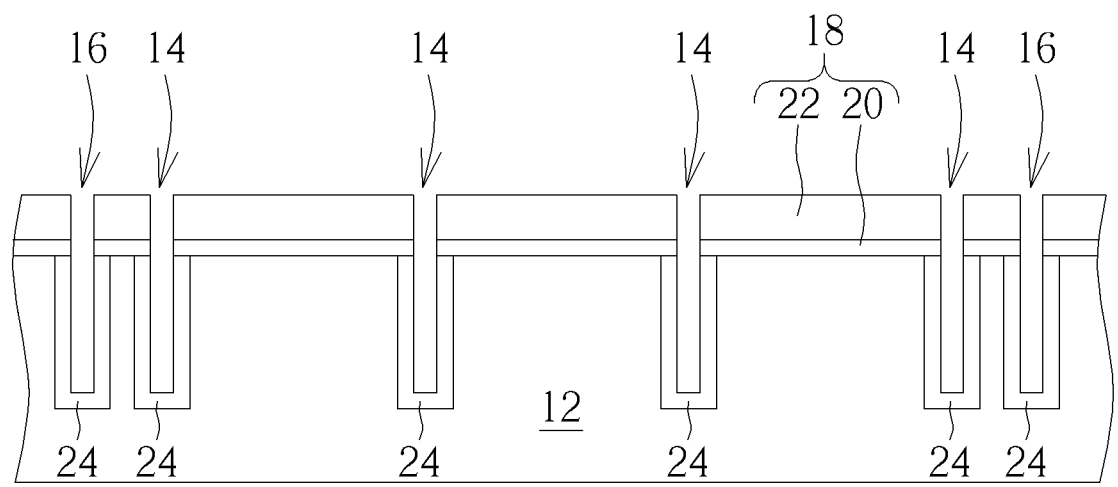
FIGS. 1-5 illustrate a method for fabricating semiconductor device according to an embodiment of the present invention.

Referring to FIGS. 1-5, FIGS. 1-5 illustrate a method for fabricating semiconductor device according to an embodiment of the present invention. As shown in FIG. 1, a substrate 12 such as a substrate having high resistance is first provided, and a plurality of trenches 14, 16 are formed in the substrate 12. In this embodiment, an insulating material is preferably deposited into the trench 14 in the later process to form into deep trench isolation structure for isolating MOS transistors and another insulating material is also deposited in the trench 16 in the later process to form trap rich isolation structure for isolating noises between devices.

According to an embodiment of the present invention, the formation of the trenches 14, 16 could be accomplished by first forming a mask layer (not shown) on the substrate 12, in which the mask layer preferably a dual-layered structure further includes a first mask layer 20 on the surface of the substrate 12 and a second mask layer 22 on the first mask layer 20. Next, an etching process is conducted by using a patterned resist (not shown) as mask to remove part of the second mask layer 22, part of the first mask layer 20, and part of the substrate 12 to form trenches 14, 16 in the substrate 12. Preferably, the mask layer is transformed into a patterned mask 18 during the formation of the trenches 14, 16. In this embodiment, the first mask layer 20 preferably includes silicon oxide and the second mask layer 22 preferably includes silicon nitride, but not limited thereto. Next, an oxidation process is conducted to oxidize sidewalls and bottom surfaces of the substrate within each of the trenches 14, 16 to form liners 24 in the trenches 14, 16.

Figure 2:
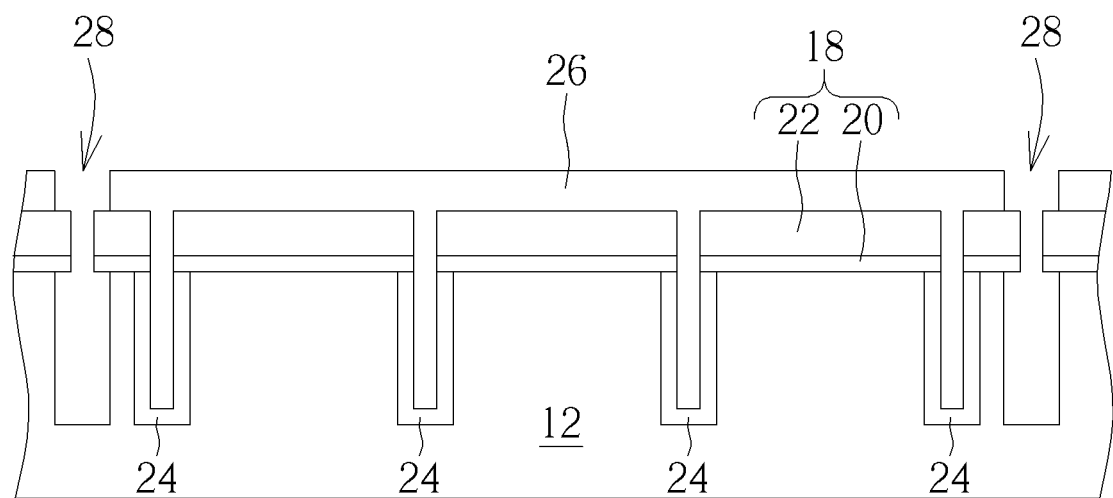

Next, as shown in FIG. 2, another patterned mask 26 is formed on the surface of the patterned mask 18 and into the trenches 14, in which the patterned mask 26 includes openings 28 exposing the trenches 16 on the outside. Next, an etching process is conducted by using the patterned mask 26 as mask to remove all of the liners 24 in the trenches 16 and expose the sidewalls and bottom surfaces of the substrate 12 in the trenches 16.

Figure 3:
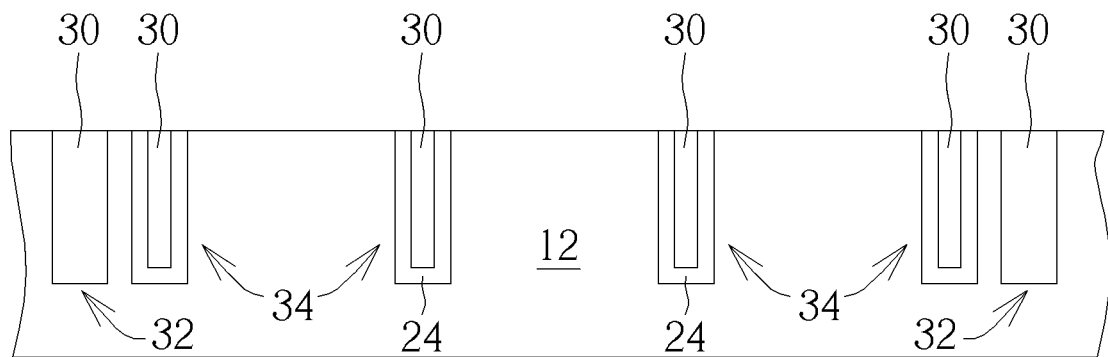

Next, as shown in FIG. 3, after removing the patterned mask 26, an insulating layer 30 is filled into the trenches 14, 16 to form trap rich isolation structures 32 in the trenches 16 and deep trench isolation structures 34 in the trenches 14. Preferably, the formation of the trap rich isolation structures 32 and deep trench isolation structures 34 is accomplished by first forming the insulating layer 30 to fill the trenches 14, 16 completely and cover the surface of the patterned mask 18, and then conducting a planarizing process such as chemical mechanical polishing (CMP) process to remove part of the insulating layer 30 and all of the patterned mask 18 so that the top surface of the remaining insulating layer 30 is even with the top surface of the substrate 12. This forms trap rich isolation structures 32 in the trenches 16 and deep trench isolation structures 34 in the trenches 14 at the same time. In this embodiment, the insulating layer 30 is preferably made of insulating material including but not limited to for example undoped polysilicon or silicon nitride.

Figure 4:
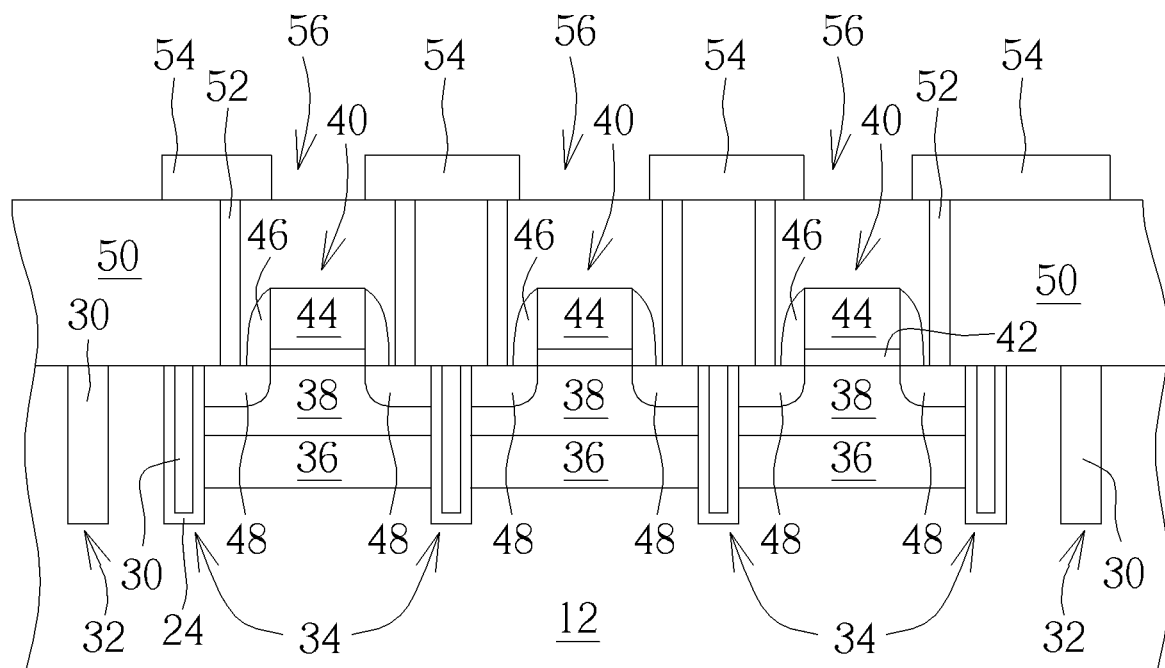
Figure 5:
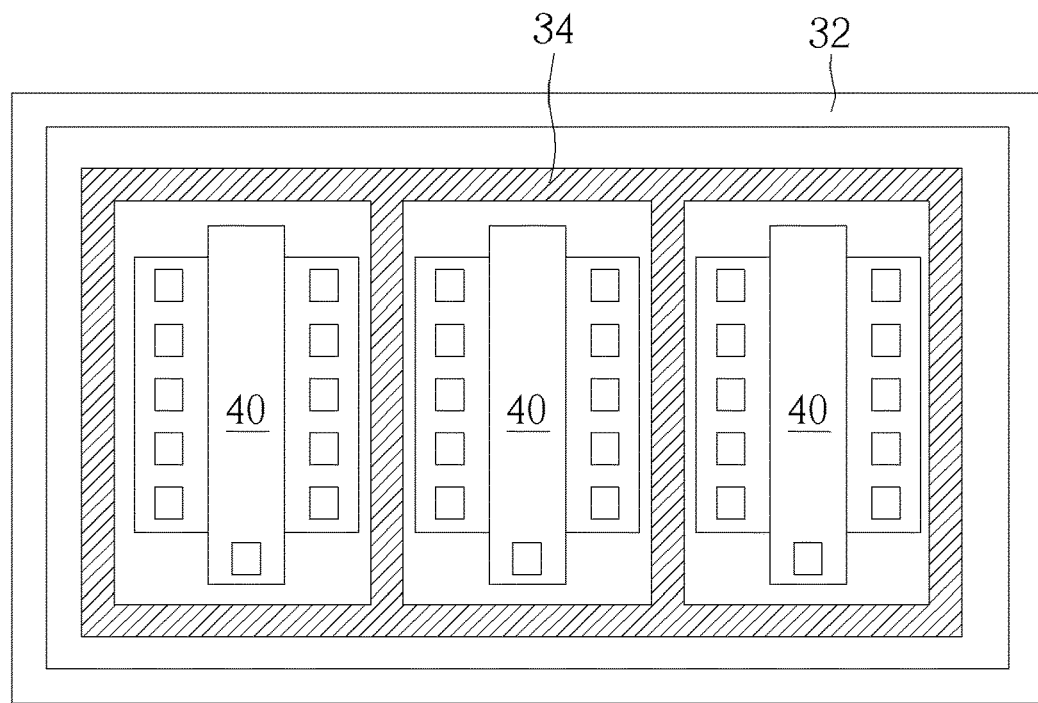

Please then referring to FIGS. 4-5, in which FIG. 4 illustrates a cross-section view fabricating the semiconductor device following FIG. 3 and FIG. 5 illustrates a top view of FIG. 4. As shown in FIG. 4, a transistor fabrication process could then be conducted by sequentially forming a deep well region and a well region in the substrate 12 and transistor elements such as gate structures 40 and source/drain regions 48 on the substrate 12.

In this embodiment, the conductive type of the deep well region and well region could be adjusted depending on the type of the transistor being fabricated. For instance, the deep well region of this embodiment preferably includes a deep n-well 36 and the well region preferably includes a p-well 38, but not limited thereto. Preferably, the formation of the gate structures 40 could be accomplished by a gate first process, a high-k first approach from gate last process, or a high-k last approach from gate last process. Since this embodiment pertains to a high-k last approach, a gate dielectric layer 42 or interfacial layer, a gate material layer 44 made of polysilicon, and a selective hard mask could be formed sequentially on the substrate 12, and a photo-etching process is then conducted by using a patterned resist (not shown) as mask to remove part of the gate material layer 44 and part of the gate dielectric layer 42 through single or multiple etching processes. After stripping the patterned resist, gate structures 40 each composed of a patterned gate dielectric layer 42 and a patterned material layer 44 are formed on the substrate 12.

Next, at least a spacer 46 is formed on the sidewalls of the each of the gate structures 40, a source/drain region 48 and/or epitaxial layer is formed in the substrate 12 adjacent to two sides of the spacer 46, and selective silicide layers (not shown) could be formed on the surface of the source/drain regions 48. In this embodiment, the spacer 46 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 48 could include n-type dopants or p-type dopants depending on the type of device being fabricated.

Next, a contact etch stop layer (CESL) (not shown) is formed on the gate structures 40, and an interlayer dielectric (ILD) layer 50 is formed on the CESL. Next, a patterned transfer or photo-etching process could be conducted by forming a patterned mask (not shown) as mask to remove part of the ILD layer 50 and CESL adjacent to the gate structures 40 for forming contact holes (not shown) exposing the source/drain regions 48 underneath. Next, metals including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs 52 electrically connecting the source/drain regions 48. Next, a metal interconnective process is conducted to form inter-metal dielectric (IMD) layer (not shown) on the ILD layer 50 and metal interconnections 54 connected to each of the contact plugs 52. This completes the fabrication of a semiconductor device according to a preferred embodiment of the present invention.

Referring again to FIGS. 4-5, in which FIGS. 4-5 further illustrate structural views of the semiconductor device according to an embodiment of the present invention. As shown in FIGS. 4-5, the semiconductor device preferably includes at least a MOS transistor such as MOS transistor 56 disposed on the substrate 12, a deep trench isolation structure 34 in the substrate 12 and around the MOS transistor 56, and a trap rich isolation structure 32 in the substrate 12 and surrounding the deep trench isolation structure 34.

In this embodiment, each of the deep trench isolation structures 34 includes a liner 24 in the substrate 12 and an insulating layer 30 disposed on the liner 24, in which the liner 24 is preferably U-shaped and the top surface of the liner 24 is even with the top surface of the insulating layer 30, and the liner 24 preferably includes silicon oxide while the insulating layer 30 is made of dielectric material including but not limited to for example undoped polysilicon or silicon nitride. In contrast to the deep trench isolation structures 34 made of two different materials, each of the trap rich isolation structures 32 is only made of a single insulating layer 30 and the insulating layer 30 within the trap rich isolation structures 32 is also made of dielectric material including but not limited to for example undoped polysilicon or silicon nitride.

It should also be noted that the trap rich isolation structures 32 and the deep trench isolation structures 34 could have same depths or different depths depending on the demand of the process or product, in which the definition of same depths could be defined as whether the bottom surface of the insulating layer 30 within each of the trap rich isolation structures 32 is even with the bottom surface of the insulating layer 30 or the bottom surface of the liner 24 within each of the deep trench isolation structures 34. For instance, even though the bottom surface of the insulating layer 30 within each the trap rich isolation structures 32 is even with the bottom surface of the liner 24 within each of the deep trench isolation structures 34 in this embodiment, the bottom surface of the insulating layer 30 within each of the trap rich isolation structures 32 could also be even with the bottom surface of the insulating layer 30 within each of the deep trench isolation structures 34, which is also within the scope of the present invention.

If the trap rich isolation structures 32 and the deep trench isolation structures 34 were to have different depths, the bottom surface of the insulating layer 30 within each of the trap rich isolation structures 32 could be slightly lower than the bottom surface of the liner 24 within each of the deep trench isolation structures 34 or the bottom surface of the liner 24 within each of the deep trench isolation structures 34 could be slightly lower than the bottom of the insulating layer 30 within each of the trap rich isolation structures 32, which are all within the scope of the present invention.

Figure 6:
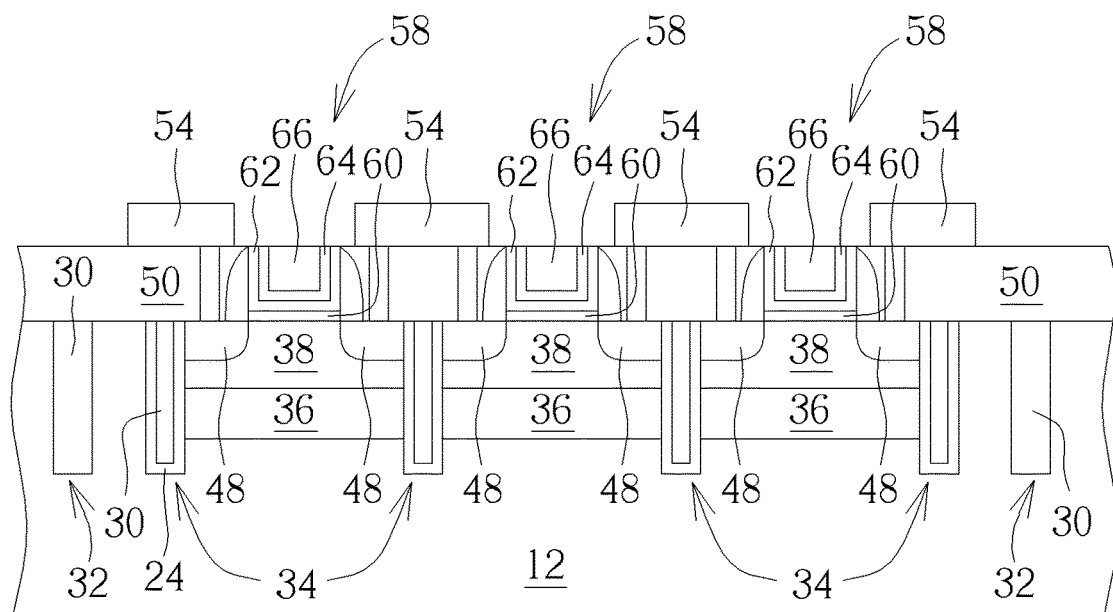
FIG. 6 illustrates a structural view of a semiconductor device according to an embodiment of the present invention.

Next, as shown in in FIG. 6, a replacement metal gate (RMG) process according to a high-k last approach could be conducted to transform the gate structures 40 made of polysilicon material from aforementioned embodiment into metal gates 58. As shown in FIG. 6, a planarizing process such as CMP could be first conducted to remove part of the ILD layer 50 and part of the CESL to expose the gate material layers 44 made of polysilicon so that the top surface of the gate material layers 44 are even with the top surface of the ILD layer 50.

Next, a replacement metal gate (RMG) process is conducted to transform the gate structures 40 into metal gates 58. For instance, the RMG process could be accomplished by first performing a selective dry etching or wet etching process using etchants including but not limited to for example ammonium hydroxide (NH$_4$OH) or tetramethylammonium hydroxide (TMAH) to remove the gate material layers 44 and even gate dielectric layers 42 in each of the gate structures 40 for forming recesses (not shown) in the ILD layer 50.

Next, a selective interfacial layer 60 or gate dielectric layer (not shown), a high-k dielectric layer 62, a work function metal layer 64, and a low resistance metal layer 66 are formed in the recesses, and a planarizing process such as CMP is conducted to remove part of low resistance metal layer 66, part of work function metal layer 64, and part of high-k dielectric layer 62 to form metal gates 58. In this embodiment, the gate structures or metal gates 58 fabricated through high-k last process of a gate last process preferably includes an interfacial layer 60 or gate dielectric layer (not shown), a U-shaped high-k dielectric layer 62, a U-shaped work function metal layer 64, and a low resistance metal layer 66.

In this embodiment, the high-k dielectric layer 62 is preferably selected from dielectric materials having dielectric constant (k value) larger than 4. For instance, the high-k dielectric layer 62 may be selected from hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZr$_x$Ti$_{1-x}$O$_3$, PZT), barium strontium titanate (Ba$_x$Sr$_{1-x}$TiO$_3$, BST) or a combination thereof.

In this embodiment, the work function metal layer 64 is formed for tuning the work function of the metal gate in accordance with the conductivity of the device. For an NMOS transistor, the work function metal layer 64 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 64 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 64 and the low resistance metal layer 66, in which the material of the barrier layer may include titanium (Ti), titanium nitride (TiN), tantalum (Ta) or tantalum nitride (TaN). Furthermore, the material of the low-resistance metal layer 66 may include copper (Cu), aluminum (Al), titanium aluminum (TiAl), cobalt tungsten phosphide (CoWP) or any combination thereof.

Figure 7:
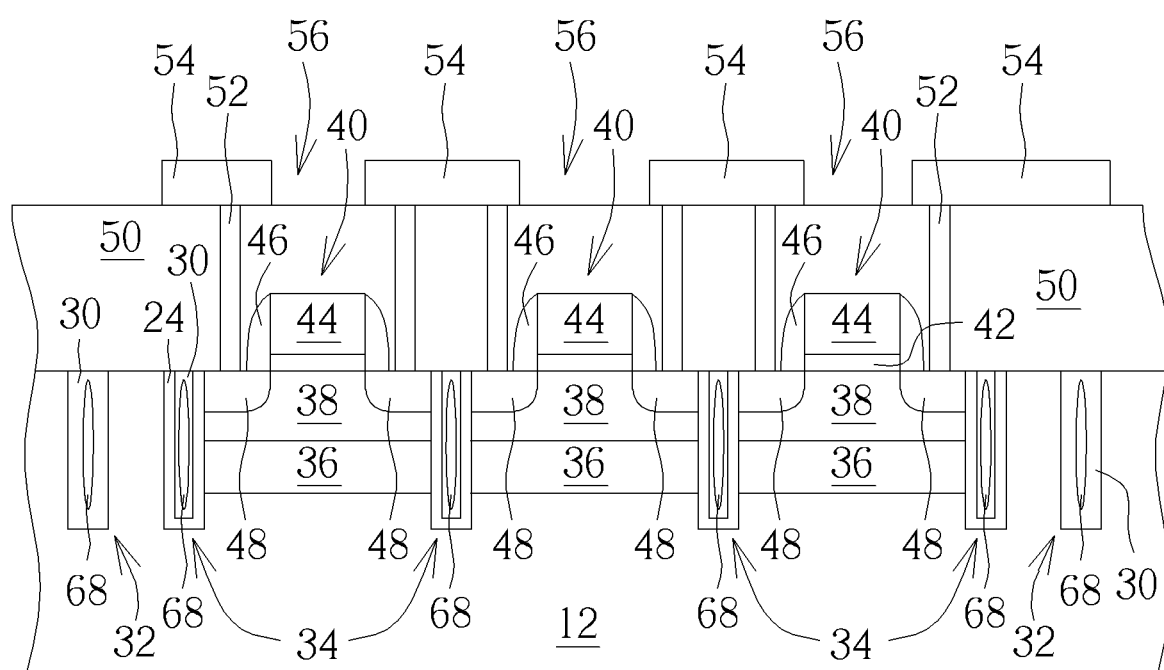
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, it would be desirable to form air gaps 68 in the trap rich isolation structures 32 and deep trench isolation structures 34 while the insulating layer 30 is deposited into the trenches 14, 16 in FIG. 3. In other words, the air gaps 68 are preferably formed within the insulating layer 30 of the trap rich isolation structures 32 and deep trench isolation structures 34. Preferably, the formation of the air gaps 68 provides an advantage of having lower resistance for the transistors so that switch performance of the semiconductor device or more specifically RF devices could be improved substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a first trench and a second trench in a substrate;
    forming a liner in the first trench and the second trench;
    forming a first patterned mask on the substrate to cover the second trench;
    removing all of the liner in the first trench;
    removing the first patterned mask after removing all of the liner in the first trench; and
    forming an insulating layer in the first trench and the second trench to form a trap rich isolation structure in the first trench and a deep trench isolation structure in the second trench, wherein the liner comprises silicon oxide and the insulating layer comprises undoped polysilicon or silicon nitride and the undoped polysilicon or silicon nitride in the insulating layer is in direct contact with the substrate exposed in the first trench.

2. The method of claim 1, further comprising:
    forming a mask layer on the substrate; and
    removing part of the mask layer and part of the substrate to form a second patterned mask on the substrate and the first trench and the second trench in the substrate.

3. The method of claim 2, wherein the mask layer comprises:
    a first mask layer on the substrate; and
    a second mask layer on the first mask layer.

4. The method of claim 3, wherein the first mask layer comprises silicon oxide and the second mask layer comprises silicon nitride.

5. The method of claim 2, further comprising:
    forming the first patterned mask on the second patterned mask;
    using the first patterned mask as mask to remove the liner in the first trench.

6. The method of claim 1, further comprising performing an oxidation process to oxidize sidewalls of the first trench and the second trench for forming the liner.

7. The method of claim 1, further comprising:
    forming the insulating layer in the first trench and the second trench after removing the first patterned mask; and
    performing a planarizing process to remove part of the insulating layer for forming the trap rich isolation structure and the deep trench isolation structure.

8. The method of claim 1, further comprising forming a first air gap in the trap rich isolation structure and a second air gap in the deep trench isolation structure.

9. The method of claim 1, wherein the first trench and the second trench comprise same depth.

10. The method of claim 1, wherein the first trench and the second trench comprise different depths.

* * * * *